United States Patent [19]

Yu et al.

[11] 3,919,667

[45] Nov. 11, 1975

[54] AVALANCHE DIODE OSCILLATOR

[75] Inventors: Se Puan Yu; Wirojana Tantraporn, both of Schenectady, N.Y.

[73] Assignee: General Electric Company, Schenectady, N.Y.

[22] Filed: Dec. 18, 1974

[21] Appl. No.: 533,691

Related U.S. Application Data

[63] Continuation-in-part of Ser. No. 399,313, Sept. 21, 1973, abandoned.

[52] U.S. Cl. ................ 331/96; 331/101; 331/107 R

[51] Int. Cl.$^2$ ................ H03B 9/12

[58] Field of Search ................ 331/96, 101, 107 R

[56] References Cited

UNITED STATES PATENTS

| | | | |
|---|---|---|---|
| 3,628,185 | 12/1971 | Evans et al. | 331/107 R |
| 3,659,222 | 4/1972 | Assour et al. | 331/107 R X |
| 3,714,605 | 1/1973 | Grace et al. | 331/101 X |
| 3,793,539 | 2/1974 | Clorfeine | 331/107 R X |

*Primary Examiner*—Siegfried H. Grimm

*Attorney, Agent, or Firm*—Julius J. Zaskalicky; Joseph T. Cohen; Jerome C. Squillaro

[57] ABSTRACT

A circuit for the operation of an avalanche diode in the TRAPATT mode including a resonator resonant at an integral multiple of the TRAPATT frequency of operation and being provided with a predetermined capacitance. The predetermined capacitance is charged from a high impedance current source to a voltage which produces TRAPATT oscillations of current in the diode. The oscillations of current of TRAPATT or fundamental frequency excite the resonator to provide oscillations at the resonant frequency of the resonator thereof which are additively superimposed on the voltage of TRAPATT frequency developed on the capacitor from the high impedance source.

8 Claims, 4 Drawing Figures

AVALANCHE DIODE OSCILLATOR

This application is a continuation-in-part of application Ser. No. 399,313 filed Sept. 21, 1973, and now abandoned.

The present invention relates in general to high frequency oscillators utilizing avalanche diodes and in particular to circuits the operating parameters of which are set with respect to the dynamic characteristics of the avalanche diode to provide high frequency oscillations.

This application is related to U.S. Pat. No. 3,836,872, assigned to the assignee of the present application and incorporated herein by reference thereto.

Avalanche diodes in a variety of forms are utilized in circuits to provide high frequency oscillations. In one form the avalanche diode comprises a body of semiconductor material including an end region of one conductivity type and relatively high conductivity, an intermediate region of opposite conductivity type and of relatively moderate conductivity, and another end region of opposite conductivity type and relatively high conductivity. Conveniently, such diodes are designated in the art as P+NN+ or N+PP+ diodes. In one mode of operation of such diodes as oscillators, referred to as the IMPATT (Impact Avalanche Transit Time) mode, a resonant circuit is connected across the ends of the diode and the diode is reversely biased from a DC source at a point on the static current versus voltage characteristic where substantial avalanche multiplication of conduction carriers occurs (i.e. avalanche multiplication of the order of one million) in the intermediate region adjacent the PN junction. In steady state operation the conduction carriers of appropriate sign produced by the avalanche process move under the influence of the electric field in the intermediate region at close to saturation drift velocity and are collected at the end region remote from the PN junction. The frequency of the resonant circuit and the distance traversed by the conduction carriers in the intermediate region are correlated so that the time of transit of the avalanche carriers under the influence of electric field at saturation drift velocity substantially equals ½ the period of the high frequency wave. The current flow in the external resonant circuit due to the motion of conduction carriers in the intermediate region is substantially 180° out of phase with the high frequency voltage across the resonant circuit. Accordingly, energy from the power supply is converted into high frequency energy in the rdsonant circuit. In this mode of operation frequencies of tens of gigaHertz may be obtained with suitably constituted and proportioned avalanche diodes, and suitably tuned circuits.

In another conventional mode of operation of the avalanche diode, referred to as the TRAPATT (Trapped Plasma Avalanche Transit Time) mode, voltage in excess of the voltage required to produce IMPATT mode of operation is provided across the diode by the dc bias voltage source and an auxiliary high frequency voltage source. Such a large voltage across the diode produces an electric field intensity profile in the intermediate region which is sufficient to create an avalanche of electron-hole plasma in the highest field portion of the diode and causes collapse of the field in that portion. If the displacement current density so produced in the diode is greater than the background or fixed charge density times the saturation velocity of majority carriers, an avalanche shock front or traveling avalanche zone traverses the intermediate region from the end adjacent the PN junction to the other end thereof. The avalanche zone sweeps across the depleted intermediate region in a time equal to the background charge density times the width of the intermediate region divided by the displacement current density. This time is shorter than the time of transit of charge carriers moving at saturation drift velocity across the intermediate region. In the highly conducting state, the voltage across the diode will be small and the velocity of the carriers will be less than saturation drift velocity. During this period a large circuit dependent external current will result in the extraction of the plasma. At the end of the extraction period the diode field profile will again be close to breakdown condition ready for another cycle of operation triggered by the auxiliary circuit.

Thus, in the TRAPATT mode, the cycle of operation may be divided into three periods. An initial period during which the diode is depleted of conduction carriers, a second period during which an electron-hole plasma is formed and a third period during which the electron hole plasma is extracted or removed from the intermediate region. Current through the diode is high when the voltage across the diode is low and conversely when the voltage across the diode is high the current through the diode is low. Accordingly, high efficiency oscillations may be produced when the avalanche diodes are operated in suitable circuits. The frequency of oscillation is substantially lower than the frequency of oscillation produceable in the IMPATT mode of operation of the diode as charge carriers in the form of plasma are removed at low fields. The auxiliary circuit utilized for providing the high values of avalanche multiplication prior to plasma formation may be a resonant circuit, the resonant frequency of which is harmonically related to the frequency of operation in the TRAPATT mode. A distinctive element of operation of the avalanche diode in the TRAPATT mode is the fact that an avalanche shock front is produced and it traverses the intermediate region of the diode in a time short compared to the time of transit of carriers at saturation drift velocity. The literature is replete with descriptions of avalanche diodes and their circuits for both IMPATT and TRAPATT modes of operation. A survey of such diodes and their circuits is contained in an article by Bernard C. Deloach, Jr. in IEEE Journal of Solid State Circuits, Vol. SC-4, No. 6, December 1969, entitled "Modes of Avalanche Diodes and Their Associated Circuits."

Heretofore, complex and bulky circuit arrangements were necessary to pprovide the large driving voltage necessary to initiate and sustain TRAPATT mode of operation.

The present invention is directed to providing simple and compact circuits for use with avalanche diodes for initiating and sustaining TRAPATT type oscillations.

Another object of the present invention is to provide circuits for producing TRAPATT or anamalous mode oscillations in avalanche diodes by circuits which are easy to operate.

Another object of the present invention is to provide circuits for operating avalanche diodes in the TRAPATT mode of excellent frequency stability.

Another object of the present invention is to provide circuits for operating avalanche diodes in the TRAPATT mode which provide TRAPATT oscillation only at discrete subharmonics of the resonant frequency of a resonator.

Another object of the present invention is to provide circuits for operating avalanche diodes in the TRAPATT mode which are not only reliable in starting but are rapidly started to provide TRAPATT mode oscillations.

A further object of the present invention is to provide TRAPATT mode oscillations in conjunction with avalanche diodes operating at low average current densities.

In carrying out the invention in one illustrative embodiment there is provided an electromagnetic resonator resonant at a predetermined frequency including a first conductive member having a first surface and a second conductive member having a second surface in opposed relationship to the first surface, the first conductive member is proportioned and spaced in relationship to the second conductive member to provide a predetermined capacitance. An avalanche diode is provided comprising a body of semiconductor material including a pair of electrodes secured thereto and an intermediate region of relatively moderate conductivity included therein. One of the electrodes of the diode is connected to the first conductive member and and the other of the electrodes is connected to the second conductive member in the low field-high current region of the resonator. A source of charging current is connected in circuit with the predetermined capacitance to charge the predetermined capacitance to a voltage at which the intermediate region of the diode is depleted of majority carriers and exceeds the voltage at which substantial avalanche multiplication of conduction carriers occurs in the intermediate region. The current source is constituted to provide current flow to the predetermined capacitance which causes the voltage across the capacitance to continue to rise after initiation of substantial avalanche multiplication in the diode to a value at which an avalanche shock front occurs in and traverses the intermediate region to generate an electronhole plasma therein. The predetermined capacitance has a value in relation to the voltage at which substantial avalanche multiplication occurs in the diode to hold sufficient charge therein to supply the intermediate region with charge to fill the intermediate region. The current source, the predetermined capacitance and the diode are constituted so that charge flow into the diode during plasma generation substantially exceeds the charge flow into the predetermined capacitance from the source whereby the voltage on the predetermined capacitance is substantially reduced and avalanching of carriers and plasma generation is extinguished in the intermediate region of the diode. The reduced voltage on the predetermined capacitance sweeps plasma from the intermediate region of the diode and allows the predetermined capacitance to be charged again to a value of voltage above the voltage at which substantial avalanche multiplication occurs to initiate another cycle of operation. Means are provided for setting the rate of charging of the predetermined capacitance from said source to preset the frequency of the aforementioned cycle of operation to a submultiple of the predetermined frequency of the resonator whereby a harmonic component of the pulses of current flowing in the diode due to the aforementioned cycle of operation excite the resonator to provide a voltage of predetermined frequency across the capacitance in additive relationship to the voltage produced thereacross by the charging source. Means are coupled to the resonator for deriving an output.

The features of the invention which are believed to be novel are set forth with particularity in the appended claims. The invention itself, however, both as to its organization and method of operation, together with further objects and advantages thereof may best be understood by reference to the following description taken in connection with the accompanying drawings in which FIG. 1 is a diagram partially in block form and partially in section of an avalanche diode in combination with circuit elements in accordance with one aspect of the present invention.

Figure 1:
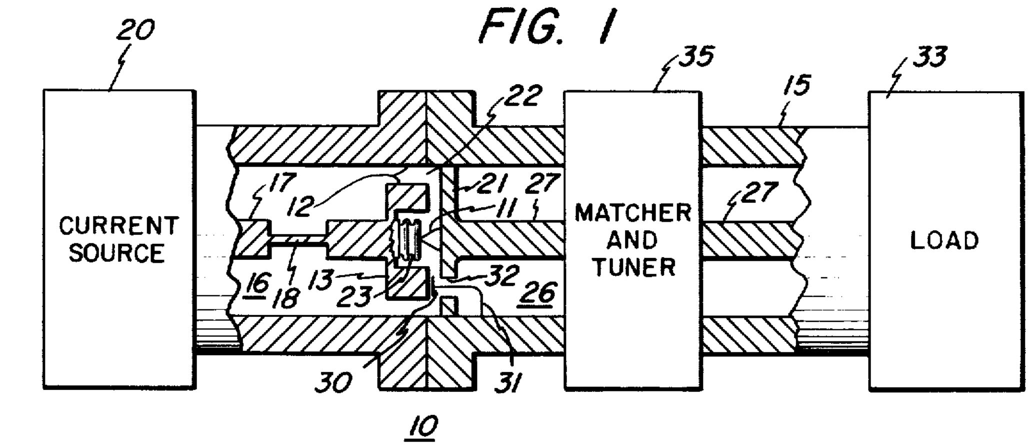

Reference is now made to FIG. 1 which shows apparatus 10 including an avalanche diode 11 and circuit elements in the form of sections of transmission line for generating high frequency oscillations. The apparatus includes a capacitor 12 in the form of a conductive disc 13 coaxially aligned and spaced with respect to a cylindrical outer conductor member 15 conveniently shown as split into two parts. An input section of coaxial transmission line 16 is provided, the outer conductor of which includes the outer conductor of cylindrical member 15 and the inner conductor 17 coaxially aligned with respect to the outer conductor includes a part 18 of reduced cross section. One end of inner conductor 17 is connected to a side wall of conductive disc 13. A source 20 of unidirectional current is connected to the other end of the inner conductor 17 and to the outer conductor 15 to provide charging current to the capacitor 12. A conductive wall member 21 is provided transverse to the axis of the cylindrical conductor member 15 to form a cavity 22 with an adjacent side wall of the disc 13. A conductive bellows member 23 which is axially extendable is provided in a recessed portion of the disc 13 and makes conductive connection to one terminal of the diode 11, the other terminal of which is connected to the conductive wall member 21. The diode 11 is coaxially aligned with the inner conductor 17 of the transmission line. The capacitance provided between the disc 13 and the outer conductor 15 as well as to a certain extent with the conductive side wall 21 represents capacitance which is charged from the current source. The source should be capable of providing current to charge capacitor 12 to voltages at which substantial avalanche multiplication of conduction carriers occurs in the diode as will be explained below. In accordance with the present invention, the resonant circuit including cavity 22 is designed to resonate at a frequency which is an integral multiple, for example three times, the desired TRAPATT frequency of operation.

An output section 26 of transmission line is also provided and includes the outer conductor member 15 and another inner conductor member 27 coaxially aligned therewith. One end of conductor member 27 is connected to the transverse conductive wall member 21.

High frequency oscillations developed in the resonant cavity are coupled to the input portion of the output section 26 of transmission line by a probe which includes a capacitive plate 30 spaced from a sidewall of the disc 13 and a lead 31 extending through an opening 32 in the wall 21 to a point on the outer conductor member 15. The other end of the output section 26 of transmission line is provided with a suitable energy utilization or load device indicated schematically by a block 33. Between the ends of the output section 26 of the transmission line is located a matching section 35 to provide impedance matching and output circuit tuning, as desired. The matching section may include a plurality of capacitive probe elements conductively connected to the outer conductor 15 at appropriate points along the length thereof and adjustably spaced from the inner conductor 27 for matching the impedance of the load 33 to the impedance seen at the input end of the output section 26, that is, in effect matching the impedance of the source represented by the coupling probe to the impedance of the load to assure maximum power transfer. Also, the matching section 35 may provide a desired degree of coupling between the load and the coupling probe to establish a desired loading of the apparatus.

The diode device 11 may be any of a variety of avalanche diodes which are capable of operation in the TRAPATT mode. One form of commonly used device comprises a body of semiconductor material including an end region of one conductivity type and relatively high conductivity, an intermediate region of opposite conductivity type and of relatively moderate conductivity and another end region of the opposite conductivity type and of high conductivity. Such diodes are conveniently designated as P+NN+ and N+PP+ diodes. For an N+PP+ diode, the condutivity in the intermediate region may, for example, be of the order of $10^{15}$ atoms per cubic centimeter net acceptor activator concentration and the net activator concentration in the end regions may be several orders of magnitude higher, for example $10^{18}$ atoms per cubic centimeter. The extent of the intermediate region between the end regions is such as to allow intermediate region to be depleted at reasonable reverse bias voltages and to establish electric fields adjacent the PN junction end of the region which will produce substantial avalanche multiplication of conduction carriers. Although not absolutely necessary, the width of the intermediate region should be set to lie within a range centered at a value equal to the saturation drift velocity of conduction carriers multiplied by ½ a period of oscillation. This is to take advantage of the additional negative resistance, although such is not a requirement for operation of the circuit of the present invention. Other diodes such as Schottky diodes, i.e. a diode in which the rectifying junction is formed by a metal member in place of a semiconductor end region, properly proportioned and constituted would work equally as well in the apparatus of FIG. 1.

The source of current 20 may be any suitable high impedance source and in one form may include a source of unidirectional voltage and a large impedance connected in series therewith. The source voltage is selected so that it is well in excess of the voltage required to produce large values of avalanche multiplication in the diode suitable for supporting TRAPATT mode operation. By utilizing a small portion of the charging characteristic of the capacitor a substantially uniform rise in voltage across the capacitor may be obtained. Such a combination of voltage source and large impedance would be an essentially constant current source and would have sufficient capability to drive the voltage across the capacitor to values which produce substantial avalanche multiplication of charge carriers in the diode. The source of current could be periodically interrupted at a low frequency rate to provide pulse modulation of the output of the apparatus and also to avoid overheating the diode.

Figure 2:
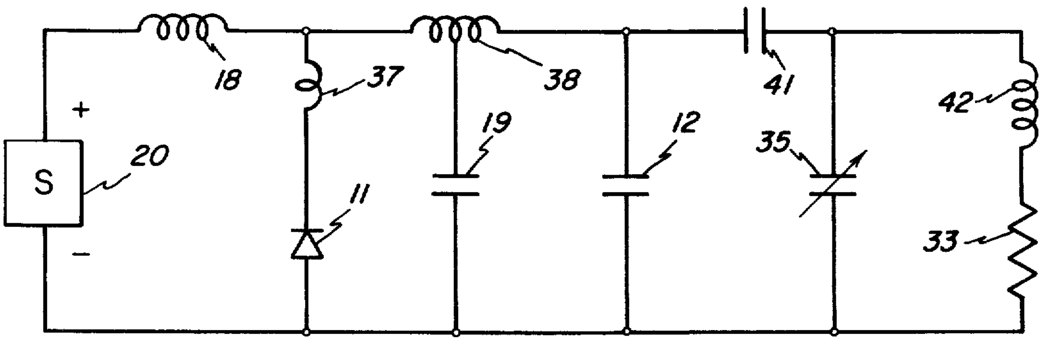
FIG. 2 is an equivalent circuit representation of the diode and circuit shown in FIG. 1.

Reference is now made to FIG. 2 which shows an equivalent circuit of the apparatus of FIG. 1 in which elements thereof corresponding to elements of FIG. 1 are identically designated. The inductive member 18 is a high impedance at the frequencies of operation of the apparatus and limits the flow of high frequency energy to the current source 20. The source 20 is connected so that the diode 11 is reversely biased. The inductive element 37 represents series lead inductance of the diode 11. The capacitor 12 and to a lesser extent capacitor 19 provide the capacitance across which voltage builds up in response to current flow from the current source 20 to produce the operation to be described in detail in connection with FIG. 3. The capacitance 12 is the capacitance of the cylindrical portions of the disc 13 in respect to the sidewall 21 and the capacitance 19 is the capacitance of the disc 13 in respect to the wall 21. Capacitance 19 is shown connected to the center tap of inductance 38 which is essentially the inductance represented by surface portions of the disc 13 and the wall 21. The elements 19 and 38 represent the equivalent circuit of a radial transmission line. Essentially, the resonant circuit including the inductive elements 38 and 37 and the capacitance 12 and 19 is set to be resonant at a multiple, for example three times, the TRAPATT operating frequency. The capacitance 41 represents the capacitance of the plate 30 in respect to the sidewall of disc 13. The inductance 42 represents the inductance of the lead 31 as well as any inductance seen by the output transmission line section 26. The resistive load 33 is the resistance of the utilization source as seen through the matching section 35 at the coupling probe. The matching section 35 is represented by the variable capacitor 35 connected essentially in shunt with inductance 42 and resistive load 33. Preferably the output circuit generally represented by elements 42, 35 and 33 is tuned to the fundamental or base frequency component of the TRAPATT mode of operation of the diode and oscillatory circuit.

The operation on the system of FIGS. 1 and 2 will now be explained in connection with FIG. 3 which shows a graph 45 of voltage and a graph 46 of particle current for the diode as a function of time which is represented as one period of the fundamental TRAPATT mode of oscillation. Along the ordinate the voltage and current are represented in arbitrary units. Point 47 occurring before the peak of graph 45 represents a point on the DC current versus voltage characteristic of the diode at which current through the diode and hence avalanche multiplication increases at a very rapid rate with slight increase in reverse voltage. A single period of fundamental oscillation is shown for the steady state mode of operation (i.e. after oscillations have been initiated). The fundamental or TRAPATT frequency is set to be an integral submultiple of the resonant frequency of the resonant cavity 22. Three cycles of oscillations (third harmonic of fundamental of TRAPATT frequency) occurring in the resonant cavity are shown superimposed on a single sawtooth wave of charging voltage. In the steady state condition, the voltage of third harmonic frequency adds to the peak of the saw tooth wave to produce avalanche multiplication sufficient to cause a large electron-hole plasma to be formed in the diode. The plasma formed is sufficient to rapidly drop the voltage across the diode to a small value as indicated at 48 of the graph. During this time interval, the current flow into the diode increases at a rapid rate to a peak value 49. This current is supplied from the charge stored in the charging capacitor 12 and to a small extent from the current source 20. It is clear that the current waveform is rich in harmonics. The third harmonic of the current waveform reacts with the resonant circuit to develop a third harmonic voltage. In the highly conducting state the voltage across the diode 11 is low, as indicated at 48. Plasma in the diode is gradually removed and the current flow rapidly drops over a period of time to a low value at 51. At this point, the intermediate region of the diode 11 is again depleted and voltage can build up across the capacitor 12. While such build-up of voltage is occurring the third harmonic voltage sustained by energy from the resonant circuit, continues to occur and is superimposed on the sawtooth wave of voltage on the capacitor until the peak value 52 of voltage occurs at which time the next cycle is initiated.

In the state-of-the-art circuits, such as that described in U.S. Pat. No. 3,628,185-Evans et al. and also described in considerable more detail in IEEE Transactions on Microwave Theory and Techniques, Vol. MTT-17, No. 12, December 1969, pp. 1060–1067, IMPATT oscillation and a very high Q cavity are the necessary conditions to initiate TRAPATT operation. Also, TRAPATT operation occurs only after many IMPATT cycles. We have verified by actual operation that our circuit does not require IMPATT oscillation to initiate TRAPATT operation. In a circuit similar to the circuit of FIG. 1 and functionally identical, a pulse of current was applied from current source 20 to the circuit. The output waveform as viewed at the load 33 on a sampling scope and recorded on a X–Y recorder showed that the TRAPATT waveform was initiated without being preceded by higher frequency oscillations. Because of this characteristic in the operation of our circuit, it can be used in the generation of short trains of TRAPATT oscillations, i.e. short pulse applications. The larger volume required in the half-wavelength transmission line element at the fundamental frequency in the Evans et al. circuit is responsible for the poorer starting capability, as compared with out circuit where the transmission line element is eliminated. Also, in the Evans et al. circuit as the synchronization of the TRAPATT frequency and the high harmonic frequency is by means of a delay element, the frequency is independent of the operating current. In our circuit frequency synchronization is achieved by setting the charging and discharging time period so that a harmonic of this frequency, for example the third, matches the resonant frequency of the resonant circuit. The manner in which the charge-dishcarge time may be varied is disclosed in our aforementioned U.S. Pat. No. 3,836,872. Accordingly, our circuit is operable only at discrete levels of source current and the frequency stability is dependent on the frequency stability of the resonator.

As pointed out above, a cycle of the TRAPATT mode of oscillation includes a time interval in which the diode is depleted, another time interval in which the electron-hole plasma is formed in the diode and in which the current flow in the diode is very large and the voltage across the diode is very small, and a third interval in which the plasma is extracted or removed from the diode and the diode reverts to its high impedance state. In accordance with the present invention, the period of the sawtooth component of voltage across the charging capacitor is set by control of current flow into the charging capacitor from source 20 so that it is an integral submultiple of a period of the resonant circuit frequency. Under this condition TRAPATT oscillations build up on the charging capacitance and are synchronized with the resonant oscillations. Expressed in other words TRAPATT oscillations will be locked in or synchronized with oscillations in the resonant circuit and be phased so that a regularly recurring peak of such third harmonic wave occurs at each peak of the TRAPATT voltage wave on the charging capacitor.

Figure 3:
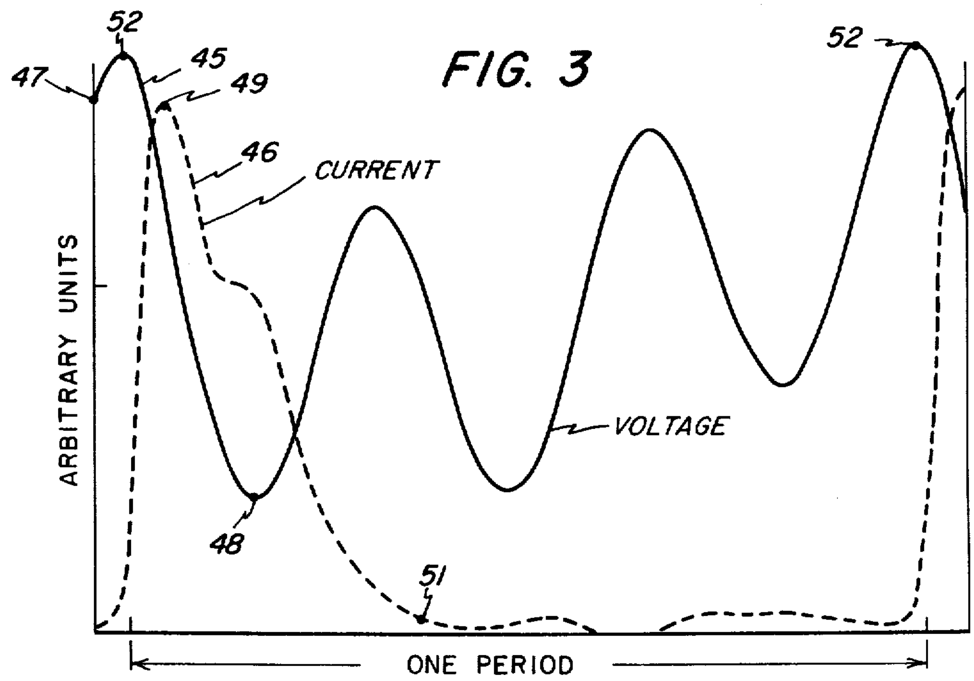
FIG. 3 shows a graph of voltage across the diode and current therethrough as a function of time for one period of steady state oscillation of the circuit of FIG. 1.

While in FIG. 3, a relationship in which the resonant frequency is three times the basic fundamental TRAPATT frequency has been depicted, other multiples such as two, four, five etc. may be used. The relationship of the amplitudes of the resonant oscillations to the amplitude of the sawtooth component of voltage may be varied. The important consideration in this regard is that the sum of the two voltage waves be sufficient to drive the diode into the TRAPATT mode of operation. The relative amplitudes of the sawtooth component of voltage in relation to the amplitude of the resonant oscillation may be varied within certain limits. With steeper rising sawtooth components of voltage smaller relative amplitude of the resonant oscillation may be utilized. Important requirements in the operation of the apparatus are that the rate of charging of the charging capacitor, or current flow from the current source, be less than the rate of charge flow from the charging capacitor to establish a highly conducting plasma in the diode and that the charging capacitor should have sufficient capacitance to hold the charge necessary to supply the diode with the current required to create the highly conducting plasma therein. When this relationship exists the charge stored in the charging cpacitor at peak voltage is comparable to the electrol-hole plasma generated in the diode.

Figure 4:
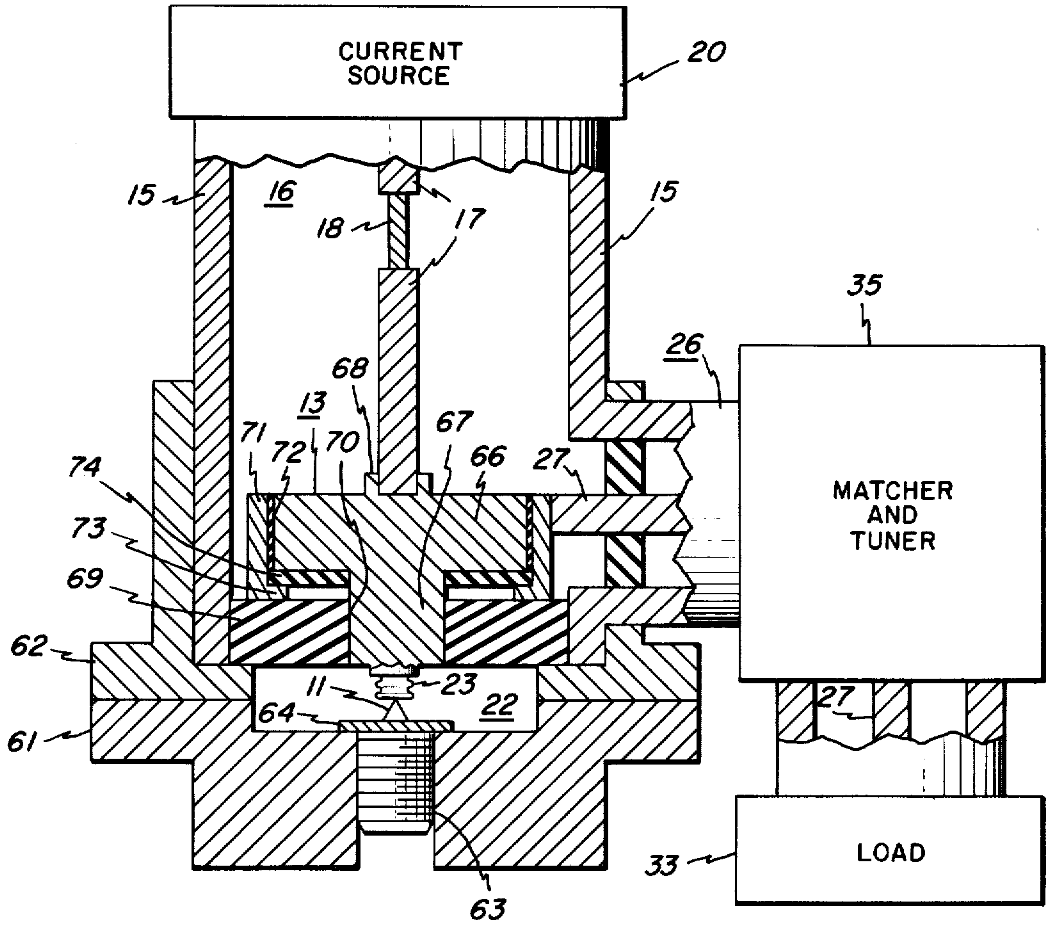
FIG. 4 is a diagram partially in block form and partially in section of an avalanche diode in combination with circuit elements in accordance with another aspect of the present invention.

Reference is now made to FIG. 4 which shows an embodiment of the present invention similar to the embodiment of FIG. 1, in which a modified cavity design is disclosed with high level power output coupling therefrom. The elements of FIG. 4, identical to the elements of FIG. 1 are identically designated. In this figure, input section 16 of the tranmission line coupled to the disc 13 is identical to the corresponding section of FIG. 1. Similarly the output section 26 of transmission line including the matcher and tuner 35 are substantially identical to the corresponding output section 26 of the embodiment of FIG. 1. In this embodiment modifications have been made in the disc 13 to permit higher power level coupling and in the supporting block members 61 and 62 which form part of the cavity 22 in which the diode 11 is mounted. The supporting block 61 provides a heat sink for the diode and its circuit. Block member 61 is provided with threaded opening 63 in which a platform 64 on which diode 11 is mounted is secured. The block member 62 abuts the block member 61 and is secured thereto by fasteners (not shown). The disc 13 has an enlarged cylindrical portion 66 and a reduced cylindrical portion 67. In the face of the enlarged portion 66 is provided a receptacle 68 into which the inner conductor 17 of the input section of tranmission line is fitted. On the end of the reduced cylindrical portion 67, the bellows member 23 is mounted and engages the terminal of the diode 11 remote from the mounting platform 64. The disc 13 is maintained in a coaxial position in respect to the diode by means of a thick cylindrical insulating member 69 having an inner opening 70 into which the reduced cylindrical section 67 fits and having an outer radius which permits the outer conductor 15 of the input section of the transmission line to be supported between the block 62 and the outer periphery of the insulating member 69. A cylindrical coupling ring 71 is provided surrounding the enlarged portion 66 of the disc capacitor and closely spaced thereto by cylindrical insulator 72. Cylindrical coupling ring 71 includes a flange portion 73 which abuts the thick cylindrical insulator 69 and also a thin cylindrical insulator 74 flush with the inner face of the enlarged portion 66 of the disc 13. Inner conductor 27 of the output transmission line 26 conductively engages the cylindrical coupling ring 71 enabling the power output to be obtained by capacitive coupling to the disc 13. The output capacitive coupling ring 71 essentially acts as a floating capacitance element or capacitance divider which provides low impedance coupling to the disc and hence provides efficient coupling of power from the cavity 22. The resonant cavity 22 essentially now embraces a more complex structure as it includes the insulating members 69 and 74 as well. The manner of operation of the apparatus of FIG. 4 is similar to the operation of the apparatus of FIG. 1.

While the invention has been described in specific embodiments, it is understood that modifications may be made by those skilled in the art, for example, other resonators such as strip line may be used in place of the radial cavity resonator shown and described, and we intend by the appended claims to cover all such modifications and changes as fall within the true spirit and scope of the invention.

What we claim as new and desire to secure Letters Patent of the United States is:

1. In combination, an electromagnetic resonator including a first conductive member having a first surface and a second conductive member having a second surface in opposed relationship to said first surface, said resonator being resonant at a first predetermined frequency, said first conductive member being of a size and spaced in relationship to said second conductive member to provide a predetermined capacitance, an avalanche diode comprising a body of semiconductor material including a pair of electrodes secured thereto and an intermediate region of relatively moderate conductivity included therein, one of said electrodes connected to said first conductive member and the other of said electrodes connected to said second conductive member in the low field-high current region of said resonator, a source of charging current connected in circuit with said predetermined capacitance to charge said predetermined capacitance to a voltage at which said intermediate region is depleted of majority carriers and exceeds the voltage at which substantial avalanche multiplication of conduction carriers occurs in said intermediate region, said current source being constituted to provide current flow to said predetermined capacitance which causes the voltage across said predetermined capaictance to continue to rise after initiation of substantial avalanche multiplication in said diode to a value at which an avalanche shock front occurs in and traverses said intermediate region to generate an electron-hole plasma therein, said predetermined capacitance having a value in relation to the voltage at which substantial avalanche multiplication occurs in said diode to hold sufficient charge therein to supply said intermediate region with charge to fill said intermediate region with plasma charge, said current source, said predetermined capacitance and said diode being constituted so that charge flow into said diode during plasma generation substantially exceeds the charge flow into said predetermined capacitance from said source whereby the voltage on said predetermined capacitance is substantially reduced and avlanching of carriers and plasma generation is extinguished in said intermediate region of said diode, said reduced voltage on said predetermined capacitance sweeping plasma charge from the intermediate region of said diode and allowing said predetermined capacitance to be charged again to a value of voltage above the voltage at which substantial avalanche multiplication occurs to initiate another cycle of operation, means for setting the rate of charging of said capacitance from said source to preset the frequency of said cycle of operation of a submultiple of said predetermined frequency of said resonator whereby a harmonic component of the pulses of current flowing in said diode due to said cycle of operation excites said resonator to provide a voltage of said predetermined frequency across said capacitance in additive relationship to the voltage produced thereacross by said charging source, means coupled to said resonator for deriving an output.

2. The combination of claim 1 in which said diode comprises a body of semiconductor material including an end region of one conductivity type and relatively high conductivity, an intermediate region of opposite conductivity type and of relatively moderate conductivity, and another end region of said opposite conductivity type and relatively high conductivity, one of said electrodes connected to one of said end regions and the other of said electrodes connected to the other of said end regions.

3. The combination of claim 1 in which said first surface and said second surface are substantially parallel.

4. The combination of claim 1 in which said resonator is a radial cavity bounded by said first conductive member and said second conductive member.

5. The combination of claim 4 in which said first conductive member includes a generally cylindrical side portion and in which said second conductive member includes a generally cylindrical surface surrounding said side portion and coaxial therewith.

6. The combination of claim 1 in which said output means includes another resonator resonant at said frequency of operation.

7. The combination of claim 5 in which said output means includes a plate closely spaced to said first conductive member.

8. The combination of claim 7 in which said plate comprises a conductive cylindrical member substantially more closely spaced to the cylindrical side portion of said first conductive member than to the cylindrical surface of said second conductor member.

* * * * *